AUTOMATIC TUNING SYSTEM UTILIZING SWEEP FREQUENCY MEANS DRIVEN BY D.C. CONTROL SIGNALS
Filed Dec. 27, 1966

INVENTOR
NOBUAKI TAKAHASHI
BY Stevens, Davis, Miller & Mosher
ATTORNEYS

United States Patent Office 3,492,584

Patented Jan. 27, 1970

3,492,584

AUTOMATIC TUNING SYSTEM UTILIZING SWEEP FREQUENCY MEANS DRIVEN BY D.C. CONTROL SIGNALS

Nobuaki Takahashi, Yokohama, Japan, assignor to Victor Company of Japan, Limited, Kanagawa-ku, Yokohama, Japan Filed Dec. 27, 1966, Ser. No. 604,806
Claims priority, application Japan, Dec. 27, 1965, 40/80,147
Int. Cl. H04b *1/16*
U.S. Cl. 325—423 3 Claims

ABSTRACT OF THE DISCLOSURE

An automatic tuning system comprising means for producing positive (A) and negative (B) D.C. voltage signals, the latter corresponding to the level of an intermediate frequency signal converted from a received signal and means for generating a signal (C) having zero voltage when the center frequency of the intermediate frequency pass band of said receiver and a carrier wave frequency of said intermediate frequency signal are equal and which changes in proportion to the difference between the carrier wave frequency and the center frequency near the center frequency. First and second detector means producing outputs corresponding to the comparison of a signal ratio $C/A$ with a predetermined first ratio and a signal ratio $C/B$ with a predetermined second ratio, respectively. Frequency sweeping means sweep the tuning frequency of the tuner circuit of the receiver and control means control the operation of the sweeping means by the outputs of the first and second detector means.

This invention relates to a system for automatically tuning a tuning circuit of a tuner in a receiver to the frequency of a signal to be received.

In a conventional tuning system, a multi-stage high frequency transformer having small loss and high selectivity, or an element having high selectivity such as a crystal filter, ceramic filter or mechanical filter, is used as a means for detecting the center carrier frequency of a signal to be received, or the center carrier frequency of the receiving frequency band is detected from a secondary intermediate frequency signal by using a double superheterodyne system to control a frequency sweep means. However, they are all complicated in structure, especially when said system is used for a high frequency FM receiver, the predetermined center carrier frequency is hard to convert to a narrow width peak voltage signal, and the materials and constructions have to be determined with accuracy.

Generally, in an automatic tuning apparatus, it is necessary to fit the tuning point in a tuning circuit with the center carrier frequency of a signal to be received. In the present invention, a system for detecting the center carrier frequency of a signal to be received is used.

A principal object of this invention is to obtain an automatic tuning system in which the tuning for a received signal can be effected automatically in simple construction.

Another object of this invention is to provide a system wherein the automatic tuning can be effected easily by detecting the center carrier frequency of a primary intermediate frequency signal frequency-converted from a received signal.

Further objects and features will become apparent from the detailed description taken in conjunction with the accompanying drawing, in which.

Figure 1:
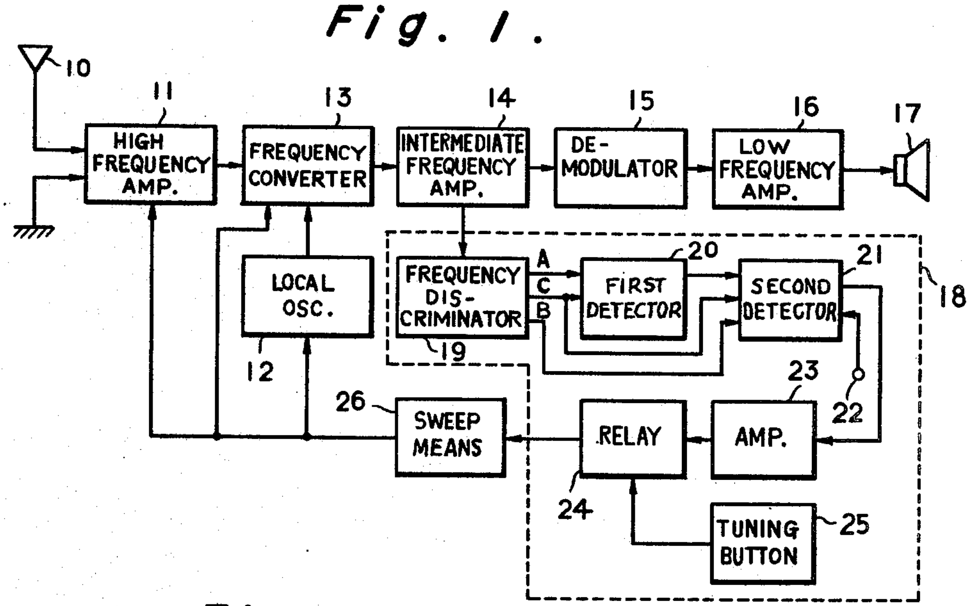
FIG. 1 is a block diagram showing one embodiment of an automatic tuning apparatus according to a system of this invention.

In FIG. 1, tuning means of a high frequency amplifying circuit 11 is tuned to a frequency of a signal to be received and the frequency is taken out of an electromagnetic input wave caught by an antenna 10. A high frequency signal from said amplifying circuit 11 and an output of local oscillator 12 are mixed in a frequency converter 13 and an intermediate frequency signal of a frequency equal to the difference between said both frequencies is obtained, said intermediate frequency signal being supplied to a next intermediate frequency amplifier 14. The high frequency amplifier circuit 11, the local oscillator 12 and the frequency converter 13 have variable reactance elements in their tuning circuits, respectively, and constitute a tuner portion of the receiver. On one hand, the intermediate frequency signal amplified by said amplifier 14 is demodulated by a demodulator 15, amplified by a next low frequency amplifier 16, supplied to a speaker 17, and reproduced as a sound. On the other hand, the intermediate frequency signal is supplied to a frequency discriminator 19 in an automatic tuner driving circuit 18 which is an important part of the system according to this invention. In said frequency discriminator 19, three kinds of signals A, C and B are developed as described hereafter, the signals A and C being supplied to a first comparison detector 20, and signals B and C being supplied to a second comparison detector 21. The output signal from said detector 20 is supplied to said detector 21. A power source —B is connected to terminal 22 for energizing a next relay circuit 24 to an ON state when said detector 21 is in an OFF state.

The output signal of said circuit 21 is supplied to the relay circuit 24 after being amplified by a direct current amplifier 23 and when a tuning button 25 is pushed, a frequency sweep means 26 is driven until the receiver tunes in a desired signal to be received.

Figure 2:
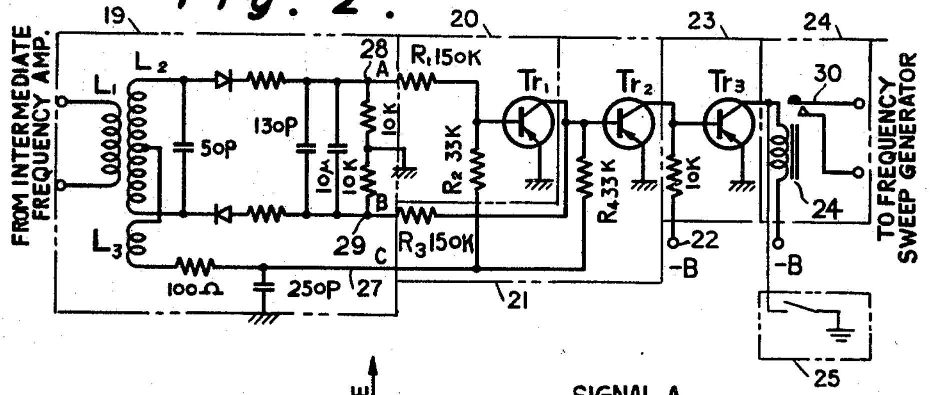
FIG. 2 is a circuit diagram showing one embodiment of the main part of the apparatus shown in FIG. 1.
Figure 3:
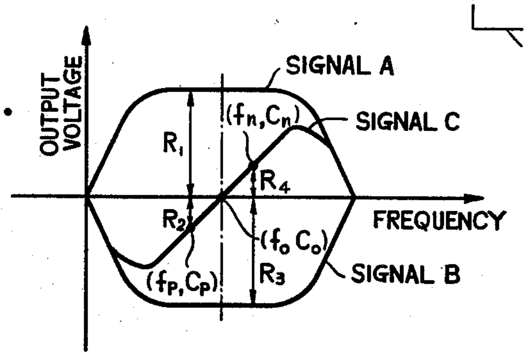
FIG. 3 is a graph showing a relation between the frequency and output voltage of signals for explaining the system of this invention.

FIG. 2 shows one embodiment of an electric circuit of said automatic tuner driving circuit 18 which is an important part of the system of this invention, and FIG. 3 shows a relation between the frequency and output voltages of said signals A, C and B. The important part of the system according to this invention will be explained in detail hereinbelow in conjunction with FIGS. 2 and 3.

The output signal from the intermediate frequency amplifier 14 is supplied to a primary coil $L_1$ of the frequency discriminator 19, which is similar to a ratio detector in an FM receiver. A direct current signal (indicated as signal C) having a magnitude corresponding to a phase difference between an electric induction current flowing in a secondary coil $L_2$ and a third coil $L_3$ connected to the center portion of said secondary coil $L_2$ is supplied to the base of a transistor $Tr_2$, described later, through a resistor $R_4$ by a line 27 and also supplied to the base of a transistor $Tr_1$, described hereinafter, through a resistor $R_2$. A positive direct current voltage (signal A) corresponding to the intermediate frequency signal which is generated by rectification of the induced intermediate frequency signal in the coil $L_2$ through a diode connected to one terminal of the coil $L_2$ is supplied to the base of the transistor $Tr_1$ through a point 28 and a resistor $R_1$. A negative direct current voltage (signal B) corresponding to the intermediate frequency signal which is generated by rectification of the induced intermediate frequency signal in the coil $L_2$ through another diode connected to the other terminal of the coil $L_2$ is supplied to the base of a transistor $Tr_2$ through a point 29 and a resistor $R_3$.

The value of said each resistor in said embodiment is determined as follows:

| | |
|---|---|
| $R_1$ | 150KΩ |
| $R_2$ | 33KΩ |
| $R_3$ | 150KΩ |
| $R_4$ | 33KΩ |

Transistor $Tr_1$ and resistors $R_1$ and $R_2$ construct the first comparison detector 20, and transistor $Tr_2$ and resistors $R_3$ and $R_4$ construct said negative the second comparison detector 21.

It is presumed for making a short explanation of the invention that the transistors used in this circuit are of PNP type having ideal characteristics and when each base potential is +0 volt, each transistor is in the OFF state and when the base potential is −0 volt, each transistor is in the ON state and the emitter potential is equal to the collector potential in each transistor. In the first comparison detector 20, when the ratio of the signal C ($A>C>B$ in voltage) corresponding to the phase difference between the currents through the coils $L_2$ and $L_3$ to the intermediate frequency signal A ($A \geqq 0$ in voltage) or ($A:-C$) is equal to ($R_1:R_2$), or $$C=\frac{-R_2}{R_1}A$$

in voltage, the transistor $Tr_1$ assumes a boundary state between nonoperating and operating states. The signal C shows a discriminating characteristic voltage in the frequency discriminator, which is normally called an S curve. Accordingly, when the voltage of the signal C is smaller than $$\frac{-R_2}{R_1}A$$

since the base voltage of the transistor $Tr_1$ is lower than the ground potential or the emitter voltage of the transistor $Tr_1$ the transistor $Tr_1$ is in the ON state, and the collector assumes zero potential, that is, an input signal to the transistor $Tr_2$ is short-circuited to ground through the transistor $Tr_1$. On the other hand; when the signal C is larger than $$\frac{-R_2}{R_1}A$$

since the base voltage of the transistor $Tr_1$ is higher than the ground potential or its emitter voltage, the transistor $Tr_1$ is in the OFF state and does not have any influence upon the input signal applied to the base of the transistor $Tr_2$. Therefore, if the transistor $Tr_2$ is in the ON state, then the base potential of the transistor $Tr_3$ is varied from −B to ground potential, so that the transistor $Tr_3$ is in the OFF state.

In the second comparison detector 21, when the ratio of the signal C corresponding to the phase difference between the currents through the coils $L_2$ and $L_3$ to the signal B ($B \leqq 0$ in voltage) corresponding to the intermediate frequency signal or ($-B:C$) is equal to ($R_3:R_4$), or $$C=\frac{-R_4}{R_3}B$$

the transistor $Tr_2$ assumes a boundary state between nonoperating and operating states. When the signal C is smaller than $$\frac{-R_4}{R_3}B$$

since the base voltage of the transistor $Tr_2$ is lower than the ground potential or its emitter voltage, the transistor $Tr_2$ is in the operating state or ON state and when the signal C is larger than $$\frac{-R_4}{R_3}B$$

since the base voltage of the transistor $Tr_2$ is higher than the ground potential or its emitter voltage, the transistor $Tr_2$ is in the OFF state. However, when the signal C is smaller than $$\frac{-R_2}{R_1}A$$

the transistor $Tr_1$ is in the ON state as previously described and the base potential of the transistor $Tr_2$ becomes a value similar to the emitter potential of the transistor $Tr_1$ or zero potential, so that the transistor $Tr_2$ is in the OFF state. Therefore, when the signal C is smaller than $$\frac{-R_2}{R_1}A$$

and larger than $$\frac{-R_4}{R_3}B$$

or $$\left(\frac{-R_2}{R_1}A>C,\ C>\frac{-R_4}{R_3}B\right)$$

the transistor $Tr_3$ is in the ON state.

Now, it is presumed that C is equal to $$\frac{-R_2}{R_1}A$$

at a frequency $fp$ and has a positive voltage $Cp$. It is also presumed that C is equal to $$\frac{-R_4}{R_3}B$$

at a frequency $fn$ and has a negative voltage $Cn$.

Further, when the carrier frequency of the intermediate frequency signal is equal to the center frequency $fo$ of the intermediate frequency pass band of the receiver, C becomes zero.

In operation of the apparatus according to this invention, at first, when the relay 24 is energized by pushing the tuning button 25, the contacts 30 of said relay move to an ON state from the OFF state, and the frequency sweep means 26, which is connected to said contacts 30, is driven. In a case where the sweep means 26 sweeps to the tuning frequency of the tuner portion higher and higher, the transistors $Tr_1$ and $Tr_2$ do not have any input signal when there is no received signal, namely, as there is no signal A, B and C present, the transistor $Tr_2$ is in the OFF state and the transistor $Tr_3$ is in the ON state, so that the relay 24 remains in an energized state and the tuning frequency of the tuner portion swept by the frequency sweep means 26 is varied to a higher level.

Next, in a case where an input signal is supplied to the coil $L_1$ and its intermediate carrier frequency $f$ is smaller than $fp$, the transistor $Tr_1$ is in the ON state by the signal C as described above and short-circuits the input signal of the transistor $Tr_2$ to the ground, so that the transistor $Tr_2$ is still in the OFF state and the tuning frequency of the tuner portion swept by the sweep means 26 is shifted to higher level. If the frequency $f$ is larger than or equal to $fp$ or $f \geqq fp$, the transistor $Tr_1$ is in the OFF state by the above presumption, and the transistor $Tr_2$ is in the ON state by the condition $$C<\frac{-R_4}{R_3}B$$

Thus the base of the transistor $Tr_3$ is grounded, the transistor $Tr_3$ is in the OFF state, and the operation of the relay 24 is stopped, so that the frequency sweep means 26 stops its function and the receiver is in a signal receivable condition.

In a case where the frequency sweep means 26 sweeps the tuning frequency of the tuner portion lower and lower by pushing the tuning button 25, the tuning frequency swept by the frequency sweep means 26 is varied to a lower level when there is no received signal, as well as in the former case.

When the input signal is supplied to the coil $L_1$ and its intermediate carrier frequency $f$ is larger than $fn$, the transistors $Tr_1$ and $Tr_2$ are in the OFF state under the above mentioned condition. Therefore, the transistor $Tr_3$ is in the ON state, and the tuning frequency swept by the frequency sweep means is varied to a lower level. Next, when the frequency $f$ is smaller than or equal to $fn$ or $f \leqq fn$, the transistor $Tr_2$ is in the ON state and the transistor $Tr_3$ is in the OFF state. Then, the receiver is in a signal receivable condition. Accordingly, in the signal receivable condition the frequency $f$ is always smaller than $fn$ and larger than $fp$ or $fp<f<fn$. It is desirable that $fn$ and $fp$, respectively, be as near as possible to the center frequency $fo$ of the intermediate frequency pass band of the receiver. When the ratios of $R_2$ to $R_1$ or $(R_1:R_2)$ and of $R_4$ to $R_3$ or $(R_3:R_4)$ are made large, $fn$ minus $fp$ becomes nearly zero, namely, $fp$, $fo$ and $fn$ are nearly equal, respectively, or $fp \doteqdot fo \doteqdot fn$, and a relay driving voltage for the center frequency can be obtained more exactly.

Further, in this embodiment the demodulator 15 and the frequency discriminator 19 are provided, separately, but in an automatic tuning apparatus, such as an FM receiver etc., both of them can be united. Even if signals obtained by detection of the intermediate frequency signal are used as the signals A and B, the above function does not change.

In said embodiment, there are obtained two kinds of signals such as the positive voltage signal A and the negative voltage signal B as voltage signals for comparison corresponding to the received signals, however, in a case where the tuning frequency of the tuner portion is always swept only in one direction, the same function will be obtained by either said signal A or signal B.

What I claim is:

1. In a superheterodyne receiver, an automatic tuning system comprising means for producing a first signal of positive direct current voltage and a second signal of negative direct current voltage corresponding to the level of an intermediate frequency signal converted from a received signal, means for generating a third signal of which the voltage is zero when the center frequency of the intermediate frequency pass band of said receiver and a carrier wave frequency of said intermediate frequency signal are equal and which voltage changes in proportion to the difference between said carrier wave frequency and said center frequency near said center frequency, a first comparison detector means for producing first and second outputs corresponding to the comparison of a first ratio of the level of said third signal to the level of said first signal with respect to a predetermined first ratio, a second comparison detector means for producing third and fourth outputs corresponding to the comparison of a second ratio of the level of said third signal to the level of said second signal with respect to a predetermined second ratio, frequency sweeping means for sweeping a tuning frequency of a tuner portion of the receiver, and controlling means for controlling the operation of said sweeping means by the outputs of said first and second comparison detector means.

2. An automatic tuning system as defined in claim 1 wherein said controlling means comprises relay means for driving said frequency sweeping means, said relay means being controlled by the outputs of said first and second comparison detector means.

3. An automatic tuning system claimed in claim 2 wherein said first comparison detector means comprises a first transistor, said first signal and said third signal being supplied to the base electrode of said first transistor via first and second resistors respectively, said second comparison detector means comprising a second transistor, said second signal and said third signal being supplied to the base electrode of said second transistor via third and fourth resistors respectively, said first transistor and said second transistor being coupled directly to each other, a third transistor coupled directly to said second transistor, and said relay means being controlled by collector current of said third transistor.

References Cited

UNITED STATES PATENTS 2,798,150 7/1957 Tate ______________ 331—4 X

ROBERT L. GRIFFIN, Primary Examiner

J. A. BRODSKY, Assistant Examiner

U.S. Cl. X.R.

325—335, 469, 470, 471; 331—4, 11